(12) United States Patent
Huang et al.

(10) Patent No.: US 12,394,479 B2
(45) Date of Patent: Aug. 19, 2025

(54) PMOS VOLTAGE SELECTION CIRCUIT WITH AN AUXILIARY SELECTION CIRCUIT TO PREVENT A FLOATING OUTPUT

(71) Applicant: eMemory Technology Inc., Hsin-Chu (TW)

(72) Inventors: Yu-Ping Huang, Hsinchu County (TW); Chun-Hung Lin, Hsinchu County (TW); Cheng-Da Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 202 days.

(21) Appl. No.: 18/144,858

(22) Filed: May 9, 2023

(65) Prior Publication Data

US 2024/0021246 A1    Jan. 18, 2024

Related U.S. Application Data

(60) Provisional application No. 63/388,258, filed on Jul. 12, 2022.

(51) Int. Cl.
*G11C 16/30* (2006.01)
*G11C 5/14* (2006.01)
*G11C 16/04* (2006.01)

(52) U.S. Cl.
CPC .......... *G11C 16/0433* (2013.01); *G11C 16/30* (2013.01)

(58) Field of Classification Search
CPC ..... G11C 16/0433; G11C 16/30; G11C 5/147; G11C 11/1673; G11C 11/1675; G11C 11/1697; G11C 16/14; G11C 16/16; G11C 16/26; G11C 11/165; H03K 19/0013; H03K 19/0944; G05F 3/262; H10B 61/20
See application file for complete search history.

(56) References Cited

U.S. PATENT DOCUMENTS

| | | | |
|---|---|---|---|
| 9,960,596 | B2 | 5/2018 | Price |
| 10,121,550 | B2 | 11/2018 | Huang |
| 10,693,461 | B1 | 6/2020 | Chang |
| 11,100,961 | B2 | 8/2021 | Yoshihara |
| 2014/0043032 | A1 | 2/2014 | Makino |
| 2014/0062204 | A1 | 3/2014 | Kim |
| 2020/0328742 | A1* | 10/2020 | Chang ...................... G11C 7/06 |

FOREIGN PATENT DOCUMENTS

| | | |
|---|---|---|
| TW | 201725860 A | 7/2017 |
| TW | 202038228 A | 10/2020 |

* cited by examiner

*Primary Examiner* — Sultana Begum
*Assistant Examiner* — Elizabeth Rose Agger
(74) *Attorney, Agent, or Firm* — Winston Hsu

(57) ABSTRACT

A selection circuit includes a main selection circuit and an auxiliary selection circuit. When a first voltage and a second voltage are different, the main selection circuit selects a higher one of the first voltage and the second voltage as an output voltage. When the first voltage and the second voltage are equal, the auxiliary selection circuit generates the output voltage according to the first voltage and the second voltage.

13 Claims, 4 Drawing Sheets

PMOS VOLTAGE SELECTION CIRCUIT WITH AN AUXILIARY SELECTION CIRCUIT TO PREVENT A FLOATING OUTPUT

CROSS REFERENCE TO RELATED APPLICATIONS

This application claims the benefit of U.S. Provisional Application No. 63/388,258, filed on Jul. 12, 2022. The content of the application is incorporated herein by reference.

BACKGROUND OF THE INVENTION

1. Field of the Invention

The invention is related to electronic circuits, and in particular, to a selection circuit for enhancing voltage supply.

2. Description of the Prior Art

Electronic devices frequently utilize a plurality of supply voltages to achieve various functions. For example, a non-volatile memory device can employ a lower voltage of 2.5V for reading memory cells and employ a higher voltage of 6V for programming the memory cells. In such a case, an electronic device is configured to output the lower voltage during a read operation and output the higher voltage during a program operation.

In the related, a selection circuit is employed in the electronic device to select between the lower voltage and the higher voltage. Nevertheless, the conventional selection circuit typically requires additional control signals to control the voltage output, increasing circuit complexity and circuit area. In another approach, the electronic device employs a selection circuit to output a highest one of the plurality of supply voltages to the subsequent circuit for high-voltage applications. However, when the plurality of supply voltages are close or equal to each other, the selection circuit will be shut off, and output a voltage lower than all of the supply voltages, leading to degradation of performance of the high-voltage applications (e.g., unable to program the memory cells).

SUMMARY OF THE INVENTION

According to an embodiment of the invention, a selection circuit includes a main selection circuit and an auxiliary selection circuit. The main selection circuit includes a first main transistor and a second main transistor. The auxiliary selection circuit includes a first auxiliary transistor, a second auxiliary transistor, a third auxiliary transistor, and a fourth auxiliary transistor. The first main transistor includes a control terminal configured to receive a second voltage, a first terminal configured to receive a first voltage, a second terminal coupled to an output terminal, and a bulk terminal coupled to the output terminal. The second main transistor includes a control terminal configured to receive the first voltage, a first terminal configured to receive the second voltage, a second terminal coupled to the output terminal, and a bulk terminal coupled to the output terminal. The first auxiliary transistor includes a control terminal, a first terminal configured to receive the first voltage, a second terminal coupled to the output terminal, and a bulk terminal coupled to the output terminal. The second auxiliary transistor includes a control terminal coupled to the control terminal of the first auxiliary transistor, a first terminal configured to receive the second voltage, a second terminal coupled to the output terminal, and a bulk terminal coupled to the output terminal. The third auxiliary transistor includes a control terminal configured to receive the second voltage, a first terminal configured to receive the first voltage, a second terminal coupled to the control terminal of the first auxiliary transistor, a bulk terminal coupled to the control terminal of the first auxiliary transistor. The fourth auxiliary transistor includes a control terminal configured to receive the first voltage, a first terminal configured to receive the second voltage, a second terminal coupled to the control terminal of the first auxiliary transistor, a bulk terminal coupled to the control terminal of the first auxiliary transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
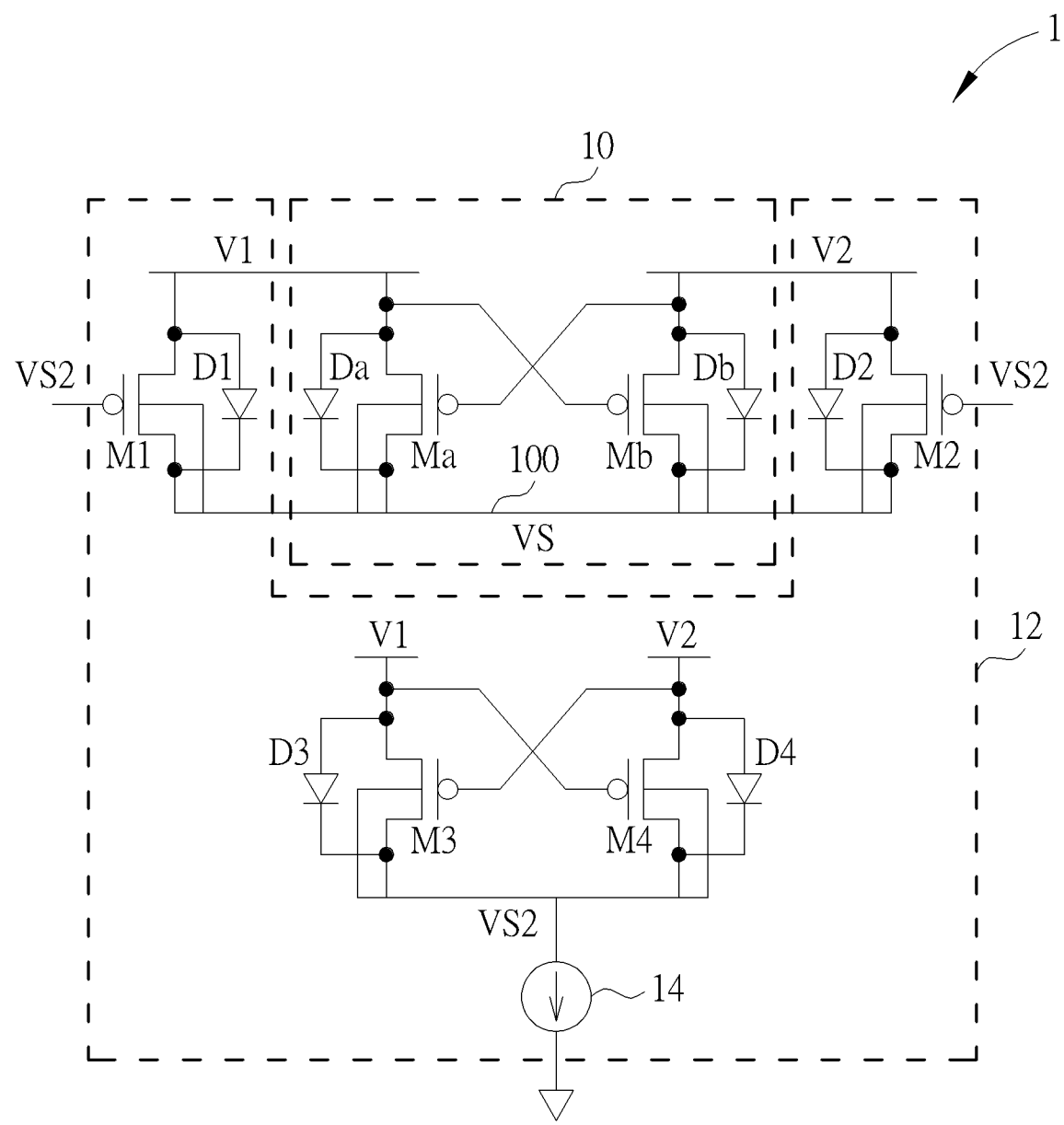
FIG. 1 is a circuit schematic of a selection circuit according to an embodiment of the invention.

FIG. 1 is a circuit schematic of a selection circuit 1 according to an embodiment of the invention. The selection circuit 1 may receive a first voltage V1 and a second voltage V2, and output an output voltage VS according to the first voltage V1 and the second voltage V2. In some embodiments, the first voltage V1 may be a system voltage in a memory system, the second voltage V2 may be a programming voltage in the memory system, and the output voltage VS may be used to operate a memory circuit to perform a read operation, a program operation and/or an erase operation. The first voltage V1 and the second voltage V2 may be equal to or different from each other. When the first voltage V1 and the second voltage V2 are different from each other, the selection circuit 1 may output a higher one of the first voltage V1 and the second voltage V2 as the output voltage VS. When the first voltage V1 and the second voltage V2 are equal or close to each other, the selection circuit 1 may output the output voltage VS at a level close to the first voltage V1 and the second voltage V2. For example, if the first voltage V1 is 2.5V, the second voltage V2 is 6V, the selection circuit 1 may output 6V as the output voltage VS. If the first voltage V1 and the second voltage V2 are both 2.5V, the selection circuit 1 may output 2.495V as the output voltage VS. In this fashion, the output voltage VS is equal or close to the highest one of the first voltage V1 and the second voltage V2 without being left floating, thereby enhancing voltage supply and enhancing performance of the high-voltage applications.

The selection circuit 1 may include a main selection circuit 10 and an auxiliary selection circuit 12. As used herein, the first voltage V1 and the second voltage V2 are referred to as being different if the first voltage V1 and the second voltage V2 are different by more than a predetermined amount; and the first voltage V1 and the second voltage V2 are referred to as being close if the first voltage V1 and the second voltage V2 are different by less than the predetermined amount. The predetermined amount may be the threshold voltage of a transistor in the selection circuit 1, and may be 0.6V. When the first voltage V1 and the second voltage V2 are different, the main selection circuit 10 may select to a higher one of the first voltage V1 and the second voltage V2 as the output voltage VS. When the first voltage V1 and the second voltage V2 are equal, the auxiliary selection circuit 12 may pull the output voltage VS to a first level close to but less than the first voltage V1 and the second voltage V2. When the first voltage and the second voltage are close but not equal, both the main selection circuit 10 and the auxiliary selection circuit 12 may pull the output voltage VS to a second level close to but less than the higher one of the first voltage V1 and the second voltage V2. The second level may be equal to or different from the first level.

The main selection circuit 10 may include a first main transistor Ma and a second main transistor Mb. The auxiliary selection circuit 12 may include a first auxiliary transistor M1, a second auxiliary transistor M2, a third auxiliary transistor M3, and a fourth auxiliary transistor M4.

The first main transistor Ma includes a control terminal configured to receive the second voltage V2, a first terminal configured to receive the first voltage V1, a second terminal coupled to an output terminal 100, and a bulk terminal coupled to the output terminal 100. The output terminal 100 may provide the output voltage VS. The first main transistor Ma may further include a body diode Da including an anode coupled the first terminal of the first main transistor Ma and a cathode coupled the second terminal of the first main transistor Ma. The second main transistor Mb includes a control terminal configured to receive the first voltage V1, a first terminal configured to receive the second voltage V2, a second terminal coupled to the output terminal 100, and a bulk terminal coupled to the output terminal 100. The second main transistor Mb may further include a body diode Db including an anode coupled the first terminal of the second main transistor Mb and a cathode coupled the second terminal of the second main transistor Mb.

The first auxiliary transistor M1 includes a control terminal, a first terminal configured to receive the first voltage V1, a second terminal coupled to the output terminal 100, and a bulk terminal coupled to the output terminal 100. The first auxiliary transistor M1 may further include a body diode D1 including an anode coupled the first terminal of the first auxiliary transistor M1 and a cathode coupled the second terminal of the first auxiliary transistor M1. The second auxiliary transistor M2 includes a control terminal coupled to the control terminal of the first auxiliary transistor M1, a first terminal configured to receive the second voltage V2, a second terminal coupled to the output terminal 100, and a bulk terminal coupled to the output terminal 100. The second auxiliary transistor M2 may further include a body diode D2 including an anode coupled the first terminal of the second auxiliary transistor M2 and a cathode coupled the second terminal of the second auxiliary transistor M2. The third auxiliary transistor M3 includes a control terminal configured to receive the second voltage V2, a first terminal configured to receive the first voltage V1, a second terminal coupled to the control terminal of the first auxiliary transistor M1, a bulk terminal coupled to the control terminal of the first auxiliary transistor M1. The third auxiliary transistor M3 may further include a body diode D3 including an anode coupled the first terminal of the third auxiliary transistor M3 and a cathode coupled the second terminal of the third auxiliary transistor M3. The fourth auxiliary transistor M4 includes a control terminal configured to receive the first voltage V1, a first terminal configured to receive the second voltage V2, a second terminal coupled to the control terminal of the first auxiliary transistor M1, a bulk terminal coupled to the control terminal of the first auxiliary transistor M1. The fourth auxiliary transistor M4 may further include a body diode D4 including an anode coupled the first terminal of the fourth auxiliary transistor M4 and a cathode coupled the second terminal of the fourth auxiliary transistor M4.

The auxiliary selection circuit 12 may further include an auxiliary current load 14 coupled to the control terminal of the first auxiliary transistor M1. The auxiliary current load 14 may draw an auxiliary load current from the control terminal of the first auxiliary transistor M1 to pull down a control voltage VS2 at the control terminal of the first auxiliary transistor M1. The control voltage VS2 will be described in more detail later. In some other embodiments, the auxiliary current load 14 shown in FIG. 1 may be replaced by the diode connected PMOS/NMOS. For example, the auxiliary current load 14 can be replaced by a PMOS transistor having a source terminal connected to the control terminal of the first auxiliary transistor M1, and a control terminal and a drain terminal connected to a ground terminal.

The first main transistor Ma, the second main transistor Mb, the first auxiliary transistor M1, the second auxiliary transistor M2, the third auxiliary transistor M3, and the fourth auxiliary transistor M4 may be P-type metal oxide semiconductor field-effect transistors (MOSFET), so as to generate the output voltage VS without being affected by the threshold voltages thereof. Further, the first main transistor Ma, the second main transistor Mb, the first auxiliary transistor M1, the second auxiliary transistor M2, the third auxiliary transistor M3, and the fourth auxiliary transistor M4 may be matched transistors, having equal transistor sizes and equal threshold voltages.

Figure 2:
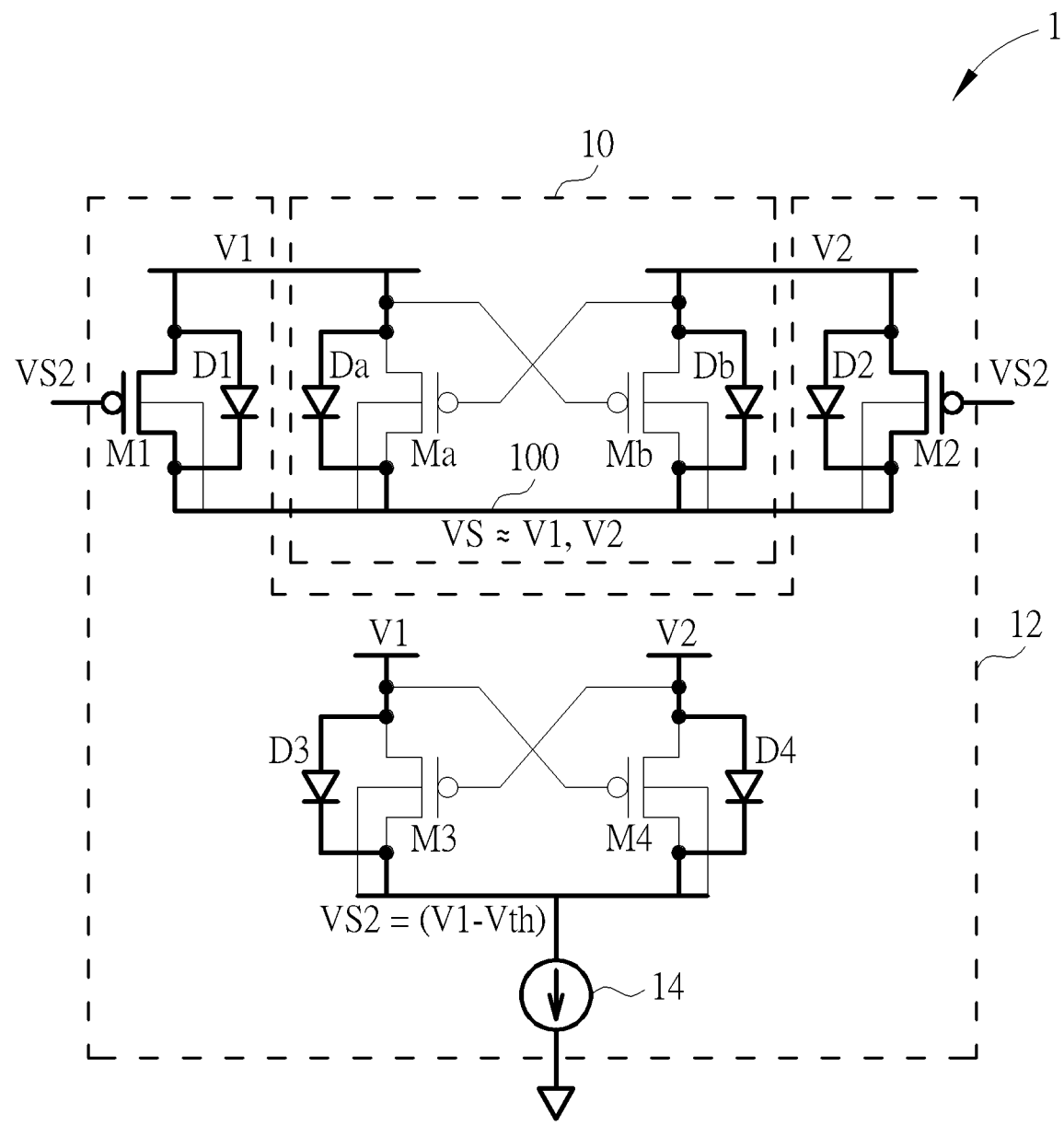
FIG. 2 shows a schematic diagram of the selection circuit in FIG. 1 for the first voltage equal to the second voltage.

FIG. 2 shows a schematic diagram of the selection circuit 1 for the first voltage V1 equal to the second voltage V2. If the first voltage V1 and the second voltage V2 are equal, the first main transistor Ma, the second main transistor Mb, the third auxiliary transistor M3 and the fourth auxiliary transistor M4 will be turned off, and the body diodes Da, Db, D1, D2, D3 and D4 will be forward biased. The body diodes D1, D2, Da and Db may set the output voltage VS to be (V1-Vth) (=V2-Vth), where Vth is the threshold voltage of the body diodes D1, D2, Da and Db. Similarly, the body diodes D3 and D4 may set the control voltage VS2 to be (V1-Vth) (=V2-Vth), where Vth is the threshold voltage of the body diodes D3 and D4. Since the control voltage VS2 is less than the first voltage V1 by the threshold voltage Vth, the first auxiliary transistor M1 and the second auxiliary transistor M2 may be slightly turned on by the control voltage VS2, so as to pull the output voltage VS from (V1-Vth) toward V1. In one example, both the first voltage V1 and the second voltage V2 may be 2.5V, and the threshold voltage may be 0.6, resulting in the control voltage VS2 of 1.9V, and pulling the output voltage VS to 2.495V, close to the first voltage V1 and the second voltage V2.

Figure 3:
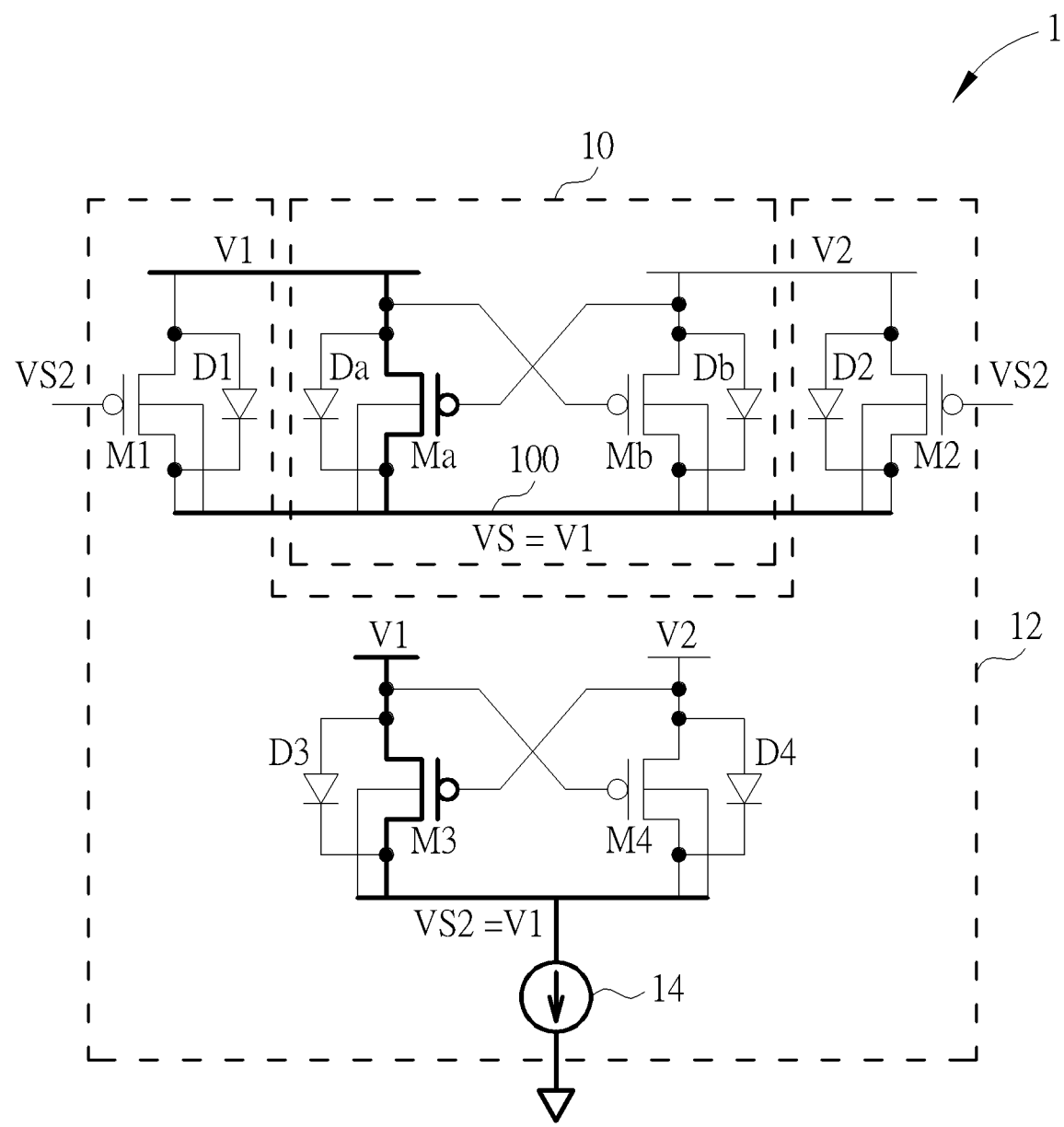
FIG. 3 shows a schematic diagram of the selection circuit in FIG. 1 for the first voltage greater than the second voltage.

FIG. 3 shows a schematic diagram of the selection circuit 1 for the first voltage V1 greater than the second voltage V2. The first voltage V1 and the second voltage V2 may be referred to as being close to each other if a difference between the first voltage V1 and the second voltage V2 is less than the threshold voltage Vth of the first main transistor Ma or the second main transistor Mb. If the first voltage V1 is greater than the second voltage V2, the first main transistor Ma and the third auxiliary transistor M3 will be turned on, the second main transistor Mb and the fourth auxiliary transistor M4 will be turned off, and the body diodes Da, Db, D1, D2, D3 and D4 will be turned off, setting the output voltage VS and the control voltage VS2 to be the first voltage V1. Since control voltage VS2 is equal to the first voltage V1, the first auxiliary transistor M1 and the second auxiliary transistor M2 may be turned off by the control voltage VS2, blocking current paths via the first auxiliary transistor M1 and the second auxiliary transistor M2. That is, the auxiliary selection circuit 12 may not affect the output voltage VS when the first voltage V1 is greater than the second voltage V2. For example, the first voltage V1 may be 6V, the second voltage V2 may be 2.5V, and the threshold voltage may be 0.6, resulting in the output voltage VS of 6V and the control voltage VS2 of 6V (=V1), turning off the first auxiliary transistor M1 and the second auxiliary transistor M2.

Figure 4:
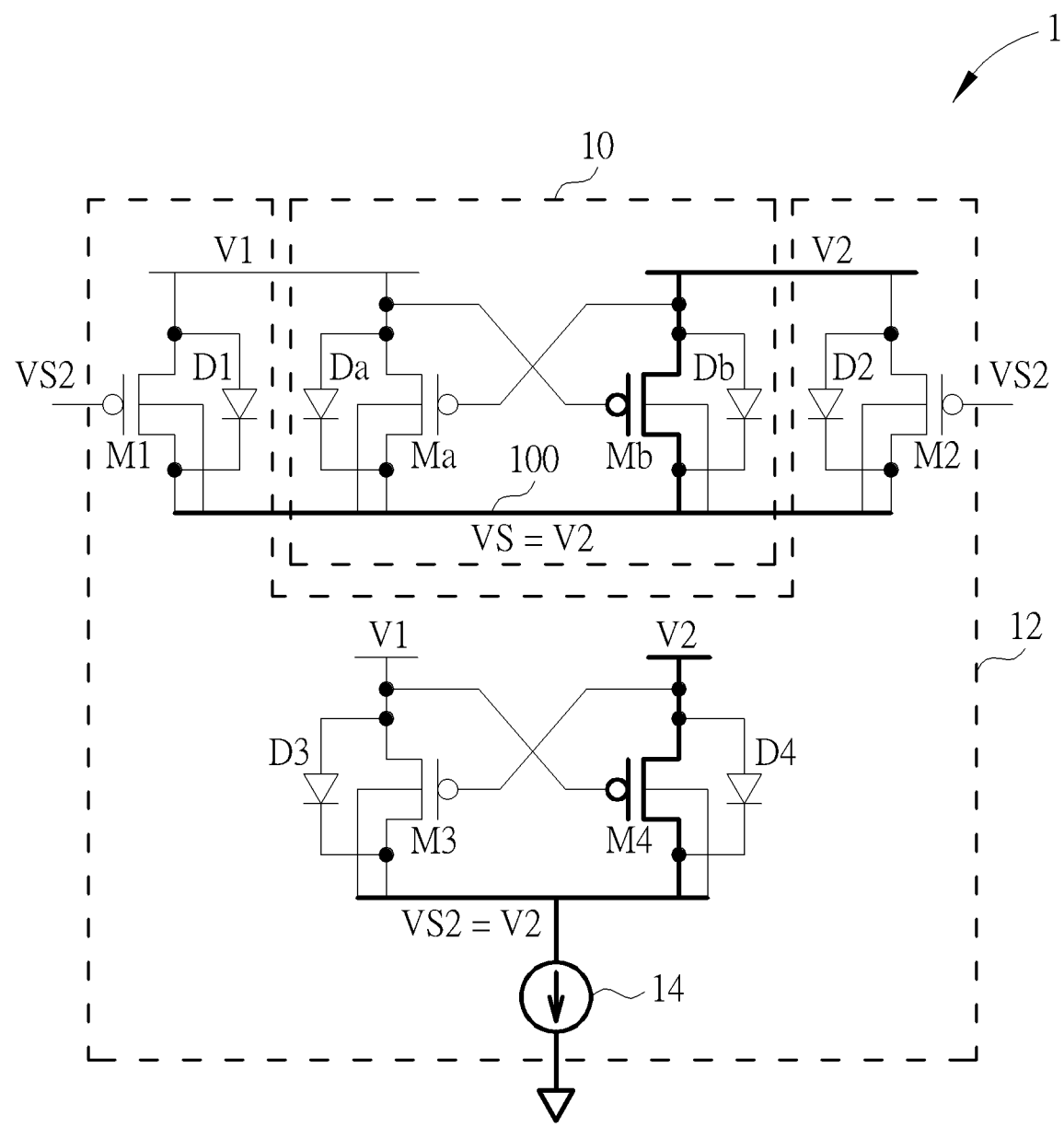
FIG. 4 shows a schematic diagram of the selection circuit in FIG. 1 for the first voltage less than the second voltage.

FIG. 4 shows a schematic diagram of the selection circuit 1 for the first voltage V1 less than the second voltage V2. If the first voltage V1 is less than the second voltage V2, the second main transistor Mb and the fourth auxiliary transistor M4 will be turned on, the first main transistor Ma and the third auxiliary transistor M3 will be turned off, and the body diodes Da, Db, D1, D2, D3 and D4 will be turned off, setting the output voltage VS and the control voltage VS2 to be the second voltage V2, respectively. Since control voltage VS2 is equal to the second voltage V2, the first auxiliary transistor M1 and the second auxiliary transistor M2 may be turned off by the control voltage VS2, blocking current paths via the first auxiliary transistor M1 and the second auxiliary transistor M2. That is, the auxiliary selection circuit 12 may not affect the output voltage VS when the second voltage V2 is greater than the first voltage V1. For example, the first voltage V1 may be 2.5V, the second voltage V2 may be 6V, and the threshold voltage may be 0.6, resulting in the output voltage VS of 6V and the control voltage VS2 of 6V (=V2), turning off the first auxiliary transistor M1 and the second auxiliary transistor M2.

If the first voltage V1 is close to but not equal to the second voltage V2, one of the first main transistor Ma and the second main transistor Mb will be partially turned on and the other one will be turned off, one of the third auxiliary transistor M3 and the fourth auxiliary transistor M4 will be partially turned on and the other one will be turned off, and the body diodes Da, Db, D1, D2, D3 and D4 will be forward biased, setting the output voltage VS and the control voltage VS2 to be less than the higher one of the first voltage V1 and the second voltage V2 but greater than at least one of (V1-Vth) and (V2-Vth). Consequently, the first auxiliary transistor M1 and the second auxiliary transistor M2 may be partially turned on, pulling the output voltage VS closer to the higher one of first voltage V1 and the second voltage V2. For example, the first voltage V1 may be 2.5V, the second voltage V2 may be 2.4V, and the threshold voltage may be 0.6V, resulting in the control voltage VS2 of 2V, and pulling the output voltage VS to 2.49V, closer to the first voltage V1.

In order to show no preference for the first voltage V1 or the second voltage V2, both the main selection circuit 10 and the auxiliary selection circuit 12 may be arranged in a symmetrical structure. That is, the transistor size of the first main transistor Ma and the transistor size of the second main transistor Mb may be equal, the transistor size of the first auxiliary transistor M1 and the transistor size of the second auxiliary transistor M2 may be equal, and the transistor size of the third auxiliary transistor M3 and the transistor size of the fourth auxiliary transistor M4 may be equal. The transistor size referred herein may be the channel width-to-length ratio of each transistor, or only the channel length of each transistor. In some embodiments, the transistor sizes of the first auxiliary transistor M1 and the second auxiliary transistor M2 may be equal to the transistor sizes of the first main transistor Ma and the second main transistor Mb, enhancing voltage supply capability when the first voltage V1 is equal or close to the second voltage V2. In some embodiments, the transistor sizes of the first auxiliary transistor M1 and the second auxiliary transistor M2 may be less than the transistor sizes of the first main transistor Ma and the second main transistor Mb, reducing the circuit size of the selection circuit 1. In some embodiments, the transistor sizes of the first main transistor Ma, the second main transistor Mb, the first auxiliary transistor M1, the second auxiliary transistor M2, the third auxiliary transistor M3, and the fourth auxiliary transistor M4 may be equal, enhancing voltage supply capability when the first voltage V1 is equal or close to the second voltage V2. In some embodiments, the transistor sizes of the first auxiliary transistor M1, the second auxiliary transistor M2, the third auxiliary transistor M3 and fourth auxiliary transistor M4 may be less than the transistor sizes of the first main transistor Ma and the second main transistor Mb, reducing the circuit size of the selection circuit 1. In some embodiments, the transistor sizes of the third auxiliary transistor M3 and the fourth auxiliary transistor M4 may be less than the transistor sizes of the first auxiliary transistor M1 and the second auxiliary transistor M2, further reducing the circuit size of the selection circuit 1. The size of the auxiliary current load 14 may match the transistor sizes of the transistor sizes of the third auxiliary transistor M3 and the fourth auxiliary transistor M4.

The selection circuit 1 employs the auxiliary selection circuit 12 to pull the output voltage VS closer to the first voltage V1 and the second voltage V2 as the first voltage V1 and the second voltage V2 are close or equal to each other, preventing the output terminal 100 from being floating, enhancing voltage supply and enhancing performance of the high-voltage applications without utilizing additional control signals and without increasing circuit complexity and circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A selection circuit comprising:
   a main selection circuit comprising:
      a first main transistor comprising:
         a first terminal coupled to a first voltage terminal;
         a control terminal coupled to a second voltage terminal; and
         a second terminal and a bulk terminal coupled to an output terminal; and
      a second main transistor comprising:
         a first terminal coupled to the second voltage terminal;
         a control terminal coupled to the first voltage terminal; and
         a second terminal and a bulk terminal coupled to the output terminal; and
   an auxiliary selection circuit comprising a first auxiliary transistor comprising:
  a control terminal;
  a first terminal coupled to the first voltage terminal; and
  a second terminal and a bulk terminal coupled to the output terminal;
a second auxiliary transistor comprising:
  a control terminal coupled to the control terminal of the first auxiliary transistor;
  a first terminal coupled to the second voltage terminal; and
  a second terminal and a bulk terminal coupled to the output terminal;
a third auxiliary transistor comprising:
  a control terminal coupled to the second voltage terminal;
  a first terminal coupled to the first voltage terminal; and
  a second terminal and a bulk terminal directly coupled to the control terminal of the first auxiliary transistor; and
a fourth auxiliary transistor comprising:
  a control terminal coupled to the first voltage terminal;
  a first terminal coupled to the second voltage terminal; and
  a second terminal and a bulk terminal directly coupled to the control terminal of the first auxiliary transistor.

2. The selection circuit of claim 1, wherein the auxiliary selection circuit further comprises an auxiliary current load coupled to the control terminal of the first auxiliary transistor, and configured to draw an auxiliary load current from the control terminal of the first auxiliary transistor.

3. The selection circuit of claim 1, wherein a transistor size of the first auxiliary transistor is equal to a transistor size of the second auxiliary transistor.

4. The selection circuit of claim 3, wherein the transistor size of the first auxiliary transistor is less than a transistor size of the first main transistor.

5. The selection circuit of claim 1, wherein a transistor size of the third auxiliary transistor is equal to a transistor size of the fourth auxiliary transistor.

6. The selection circuit of claim 5, wherein the transistor size of the third auxiliary transistor is less than the transistor size of the first main transistor.

7. The selection circuit of claim 1, wherein transistor sizes of the first auxiliary transistor, the second auxiliary transistor, the third auxiliary transistor, and the fourth auxiliary transistor are equal.

8. The selection circuit of claim 7, wherein the transistor size of the first auxiliary transistor and the transistor size of the third auxiliary transistor are less than the transistor size of the first main transistor.

9. The selection circuit of claim 1, wherein:
the first voltage terminal provides a first voltage;
the second voltage terminal provides a second voltage; and
when the first voltage and the second voltage are equal, an output voltage outputted from the output terminal is close to the first voltage and the second voltage.

10. The selection circuit of claim 9, wherein when the first voltage and the second voltage are equal, the first main transistor is turned off, the second main transistor is turned off, the first auxiliary transistor is turned on, the second auxiliary transistor is turned on, the third auxiliary transistor is turned off, and the fourth auxiliary transistor is turned off.

11. The selection circuit of claim 1, wherein:
the first voltage terminal provides a first voltage;
the second voltage terminal provides a second voltage; and
when the first voltage and the second voltage are different, an output voltage outputted from the output terminal is equal to the larger one of the first voltage and the second voltage.

12. The selection circuit of claim 11, wherein when the first voltage and the second voltage are different, one of the first main transistor and the second main transistor is turned on, and a remaining one of the first main transistor and the second main transistor is turned off, the first auxiliary transistor is turned off, the second auxiliary transistor is turned off, one of the third auxiliary transistor and the fourth auxiliary transistor is turned on, and a remaining one of the third auxiliary transistor and the fourth auxiliary transistor is turned off.

13. The selection circuit of claim 1, wherein the first main transistor, the second main transistor, the first auxiliary transistor, the second auxiliary transistor, the third auxiliary transistor, and the fourth auxiliary transistor are P-type transistors.

* * * * *